United States Patent
Nakazawa

(10) Patent No.: US 8,835,279 B2
(45) Date of Patent: Sep. 16, 2014

(54) METHOD OF MANUFACTURING SEMICONDUCTOR DEVICE

(75) Inventor: Keisuke Nakazawa, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/425,592

(22) Filed: Mar. 21, 2012

(65) Prior Publication Data
US 2013/0115766 A1 May 9, 2013

(30) Foreign Application Priority Data
Nov. 4, 2011 (JP) ................................ 2011-242590

(51) Int. Cl.
H01L 21/28 (2006.01)
H01L 21/76 (2006.01)
H01L 21/336 (2006.01)
H01L 29/76 (2006.01)
H01L 29/788 (2006.01)
H01L 21/70 (2006.01)
H01L 27/115 (2006.01)
H01L 21/764 (2006.01)

(52) U.S. Cl.
CPC ........ H01L 27/11524 (2013.01); H01L 21/764 (2013.01)
USPC ........... 438/422; 438/257; 438/296; 438/421; 257/314; 257/316; 257/522

(58) Field of Classification Search
CPC .................. H01L 27/11524; H01L 27/11521; H01L 27/11517; H01L 21/764
USPC .................. 257/314–334, 506, 522, E21.209, 257/E21.262, E21.263; 438/257, 296, 421, 438/435, 422
See application file for complete search history.

(56) References Cited

U.S. PATENT DOCUMENTS

| 7,407,864 | B2 | 8/2008 | Kawasaki et al. |
| 2006/0214258 | A1* | 9/2006 | Kiyotoshi ..................... 257/510 |
| 2008/0087935 | A1* | 4/2008 | Matsuno ....................... 257/316 |
| 2008/0090988 | A1 | 4/2008 | Nakazawa et al. |
| 2009/0036629 | A1 | 2/2009 | Kawasaki et al. |
| 2010/0019311 | A1* | 1/2010 | Sato et al. ..................... 257/326 |
| 2010/0190317 | A1 | 7/2010 | Iwasawa et al. |
| 2010/0311220 | A1 | 12/2010 | Matsuo et al. |
| 2012/0034754 | A1 | 2/2012 | Iwasawa et al. |
| 2012/0122297 | A1* | 5/2012 | Na et al. ....................... 438/435 |

FOREIGN PATENT DOCUMENTS

| JP | 2007-250656 | 9/2007 |
| JP | 2010-27922 | 2/2010 |
| JP | 2013-089859 | 5/2013 |

OTHER PUBLICATIONS

Nakazawa, K., "Semiconductor Device and Method of Manufacturing the Same," U.S. Appl. No. 13/424,071, filed Mar. 19, 2012.
Nakazawa, K., "Semiconductor Device and Method of Manufacturing Semiconductor Device," U.S. Appl. No. 13/309,730, filed Dec. 2, 2011.
Nakazawa, K. "Method of Manufacturing Semiconductor Device," U.S. Appl. No. 13/409,401, filed Mar. 1, 2012.

* cited by examiner

Primary Examiner — Fernando L Toledo
Assistant Examiner — Aaron Gray
(74) Attorney, Agent, or Firm — Finnegan, Henderson, Farabow, Garrett & Dunner, LLP

(57) ABSTRACT

According to one embodiment, a method of manufacturing a semiconductor device is provided. In the method, a tunnel insulating film and a first conductive film are formed on a semiconductor layer. A trench is formed. A first sacrifice film is buried in the trench. A second sacrifice film having density higher than that of the first sacrifice film is formed on the first sacrifice film in the trench. An insulating film is formed on the first conductive film and the second sacrifice film. A second conductive film is formed on the insulating film. The second sacrifice film is exposed. The first sacrifice film and the second sacrifice film are removed.

24 Claims, 14 Drawing Sheets

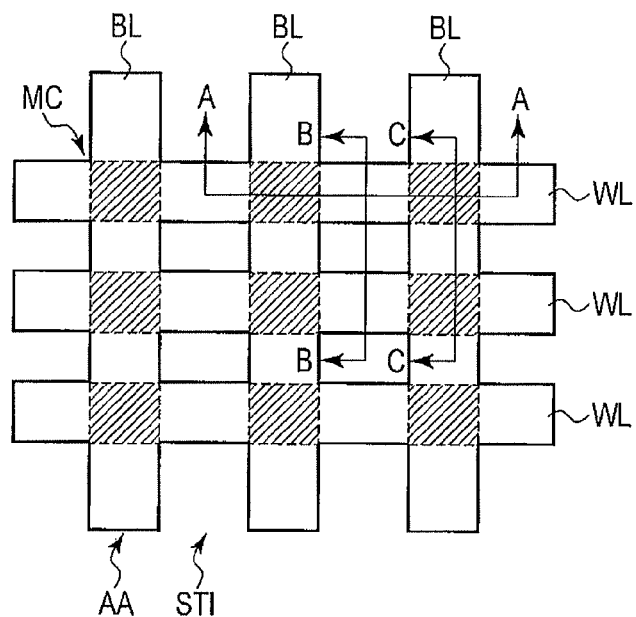
F I G. 1
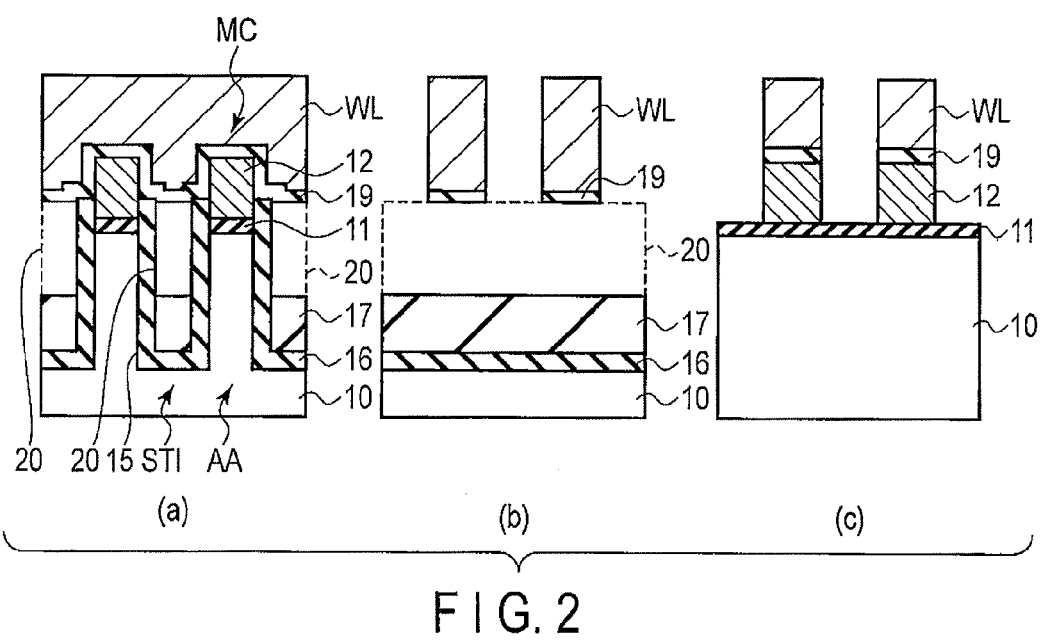
F I G. 2

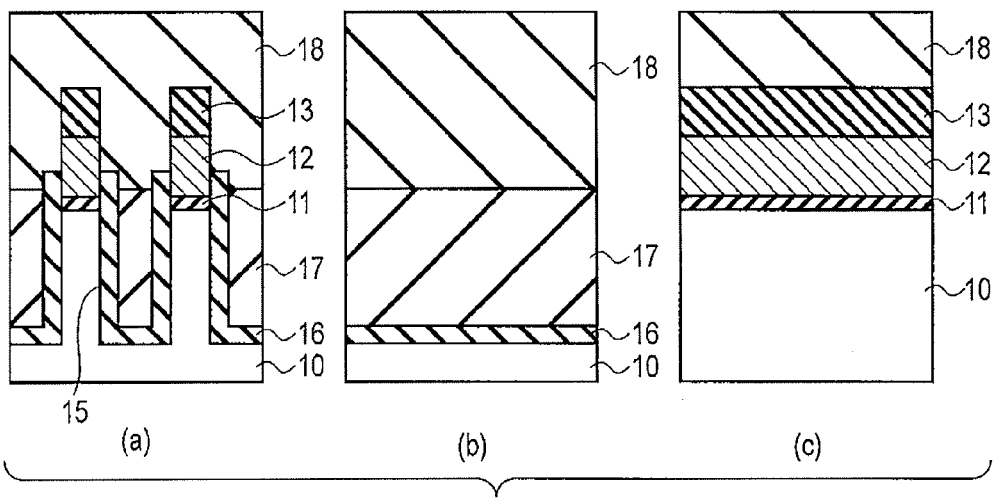
F I G. 9
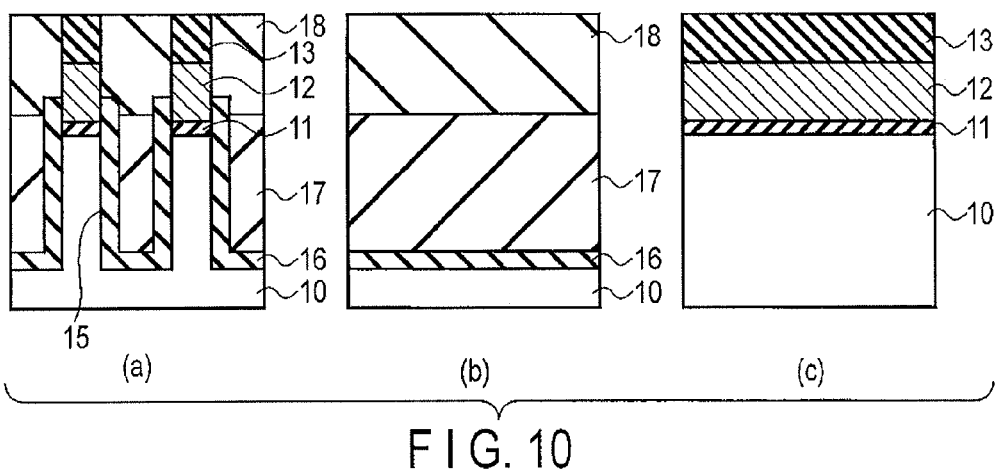
F I G. 10

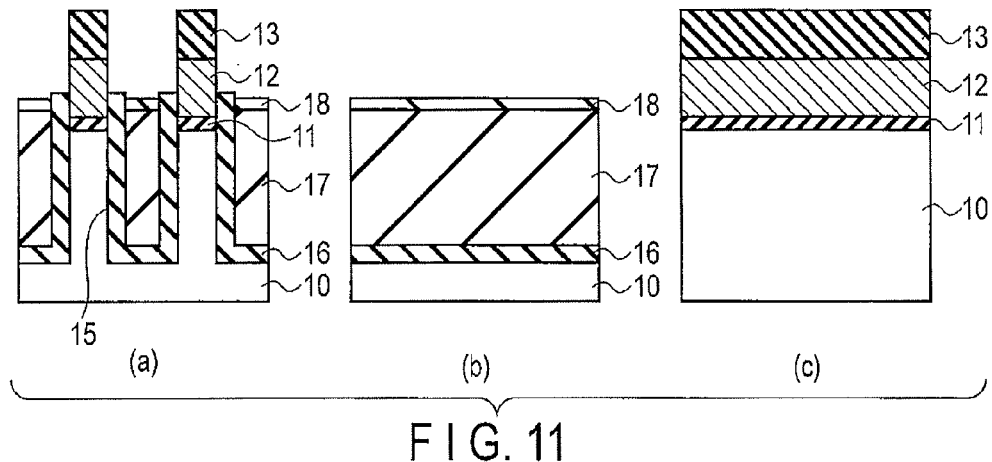
F I G. 11
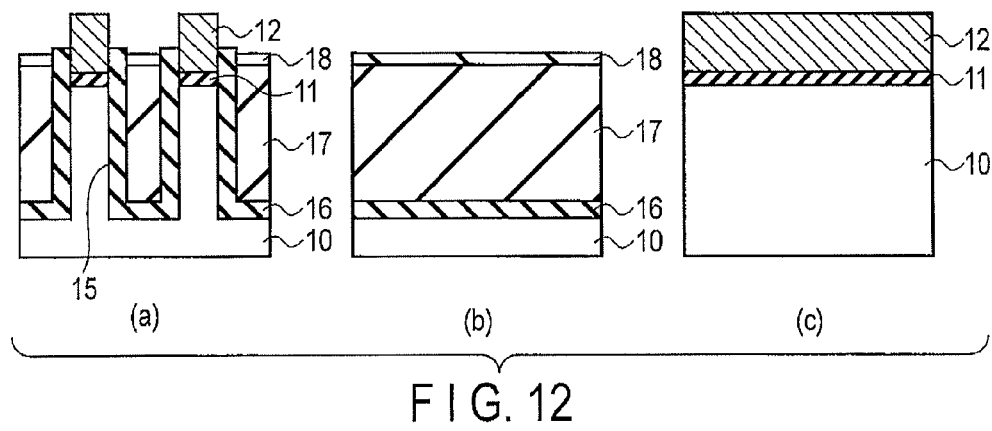
F I G. 12

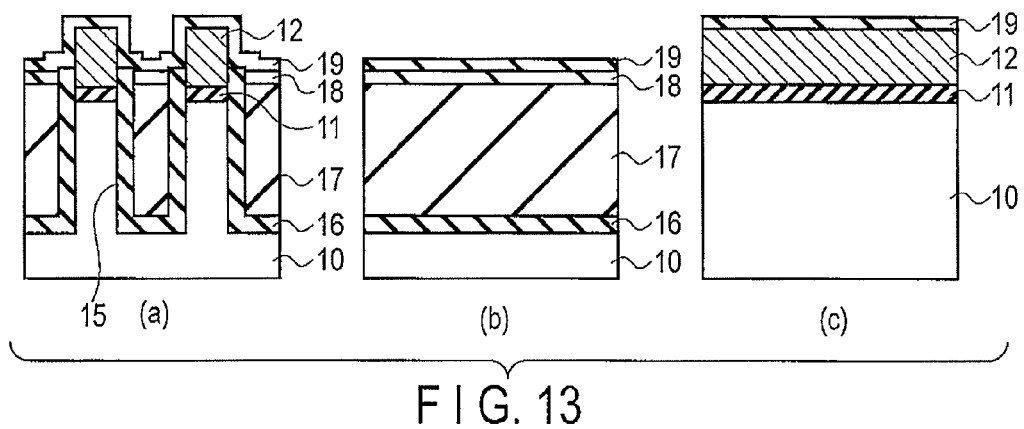
F I G. 13
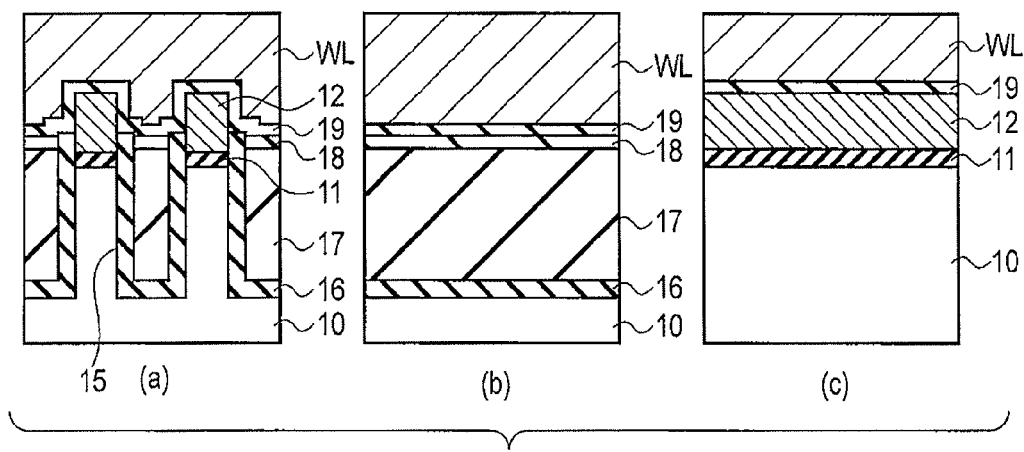
F I G. 14

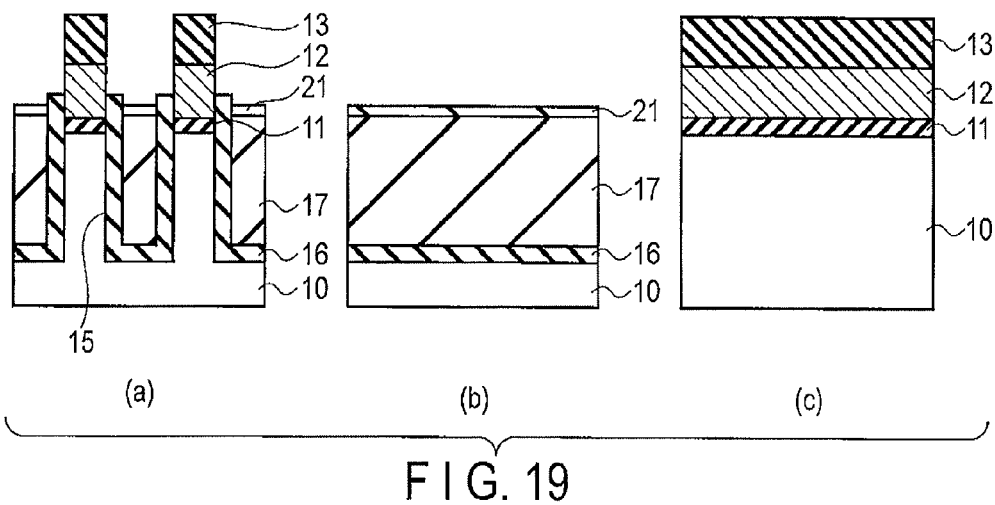
F I G. 19
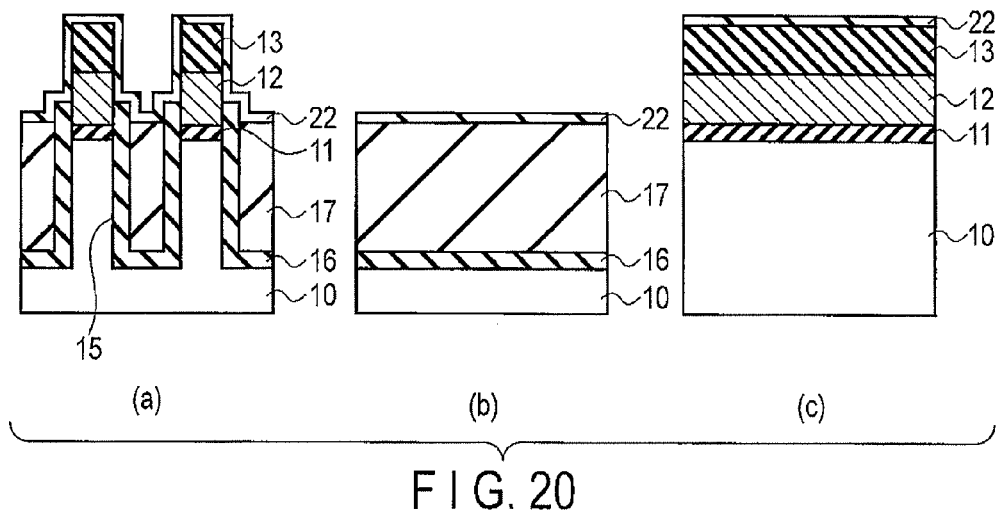
F I G. 20

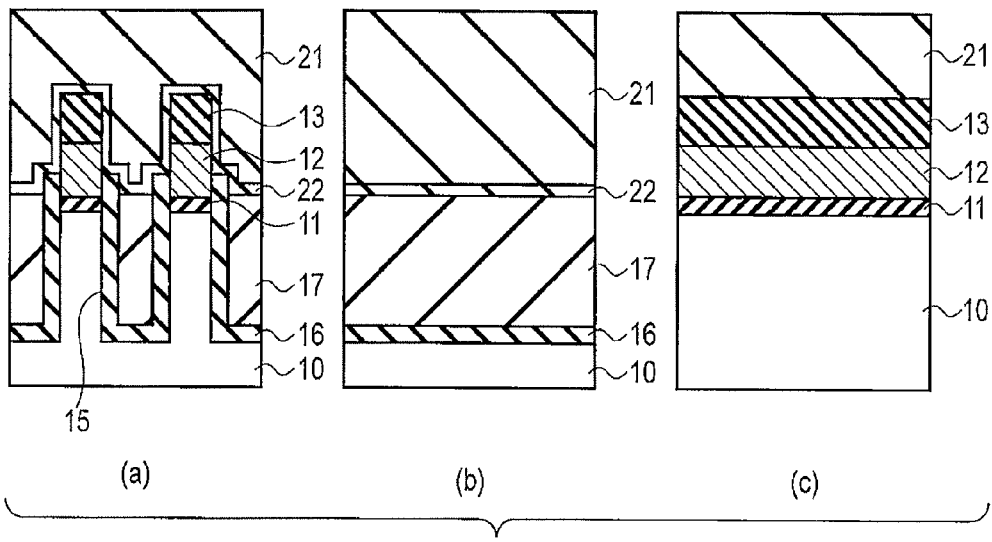
F I G. 21
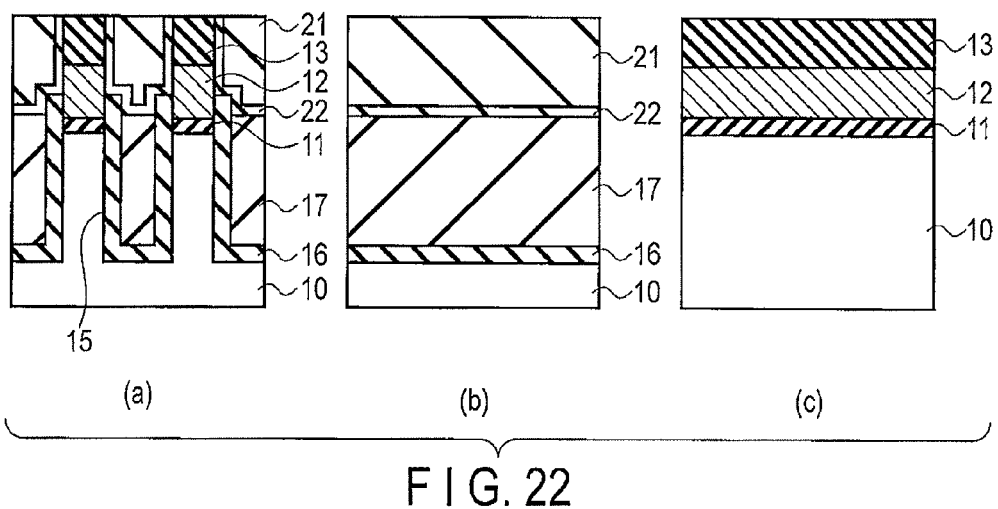
F I G. 22

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2011-242590, filed Nov. 4, 2011, the entire contents of which are incorporated herein by reference.

FIELD

Embodiments described herein relate generally to a method of manufacturing a semiconductor device.

BACKGROUND

In a NAND flash memory, an isolation system of an STI (Shallow Trench Isolation) structure is used. A silicon oxide film is used as the STI structure. A Yupin/Enda effect that a current leaks between floating gates adjacent to each other through the silicon oxide film of the STI is increased with a progress of microfabrication of an element pattern. Due to the leak current, a malfunction is generated in read/write of the memory and becomes prominent in generations from a generation of a 30-nm element size. In order to reduce the Yupin/Enda effect, the leak current in the STI is decreased by selecting various materials for the STI or proposing the structure.

For example, a method in which a cavity structure (air gap) is used in the STI can be cited in order to solve the problem. The air gap has an excellent insulating characteristic because air exists in the air gap. Additionally, because the air gap has permittivity of 1, the leak current can be decreased to the utmost limit.

However, various problems are generated in forming the air gap. For example, there is a method, in which the air gap is formed by depositing a film having a bad burying characteristic in a trench by a CVD (Chemical Vapor Deposition) method such that the trench is not filled. However, in this method, adhesion of the film to a sidewall of the trench adversely affects a charge retaining characteristic of the memory. The insulating characteristic is insufficiently obtained because of the insufficient formation of the air gap.

On the other hand, there is also proposed a method in which, after the trench is completely filled with a sacrifice film and an interelectrode insulating film is formed on the sacrifice film, the sacrifice film is partially exposed and the sacrifice film is removed by etching. A PSZ (polysilazane) film is used as the sacrifice film. However, unfortunately a large cavity serving as the air gap is hardly formed because the PSZ film has a relatively high etching resistance characteristic.

BRIEF DESCRIPTION OF THE DRAWINGS

FIG. 1 is a plan view illustrating a structure of a semiconductor device according to a first embodiment;

FIG. 2 is a sectional view illustrating the structure of the semiconductor device of the first embodiment;

FIGS. 3, 4, 5, 6, 7, 8, 9, 10, 11, 12, 13, 14, and 15 are sectional views illustrating the structure of the semiconductor device of the first embodiment;

FIGS. 16, 17, 18, and 19 are sectional views illustrating a structure of a semiconductor device according to a second embodiment; and FIGS. 20, 21, 22, 23, 24, 25, 26, and 27 are sectional views illustrating a structure of a semiconductor device according to a third embodiment.

DETAILED DESCRIPTION

Figure 3:
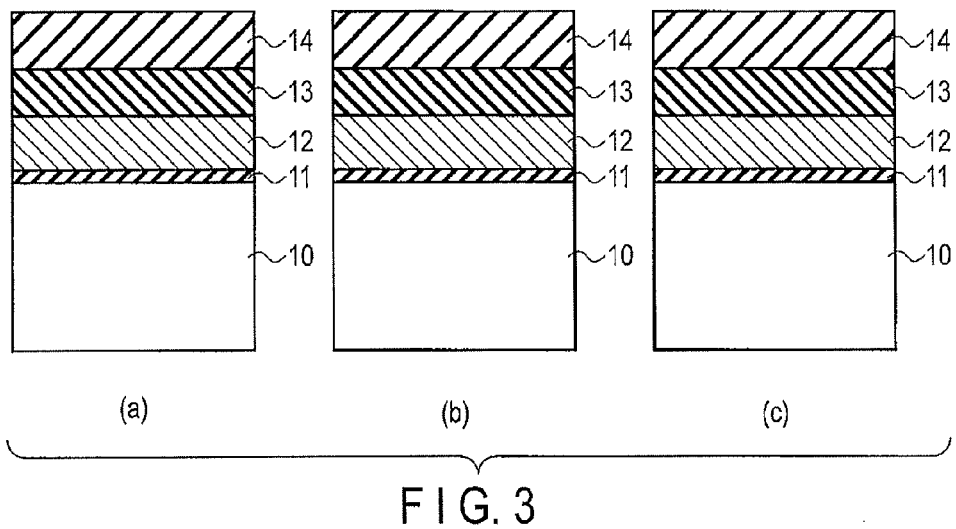
Figure 4:
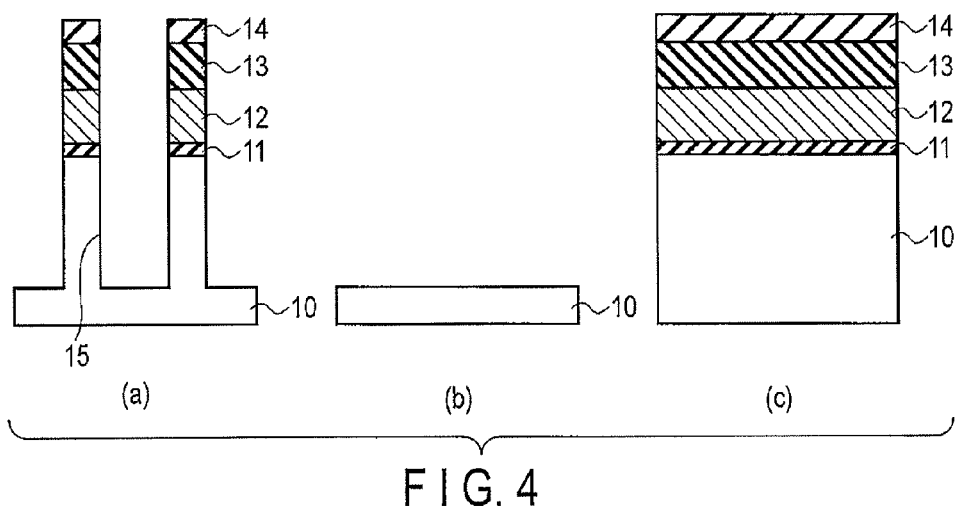
Figure 5:
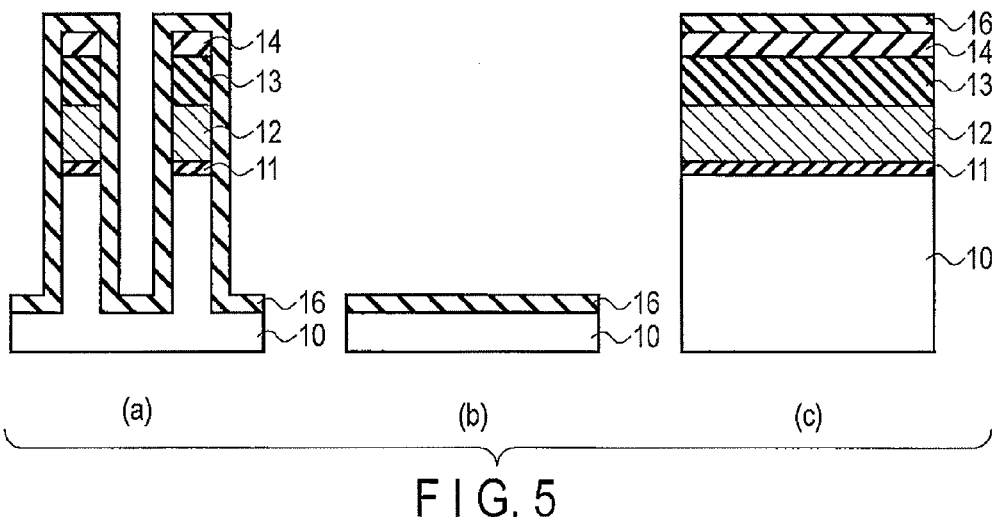
Figure 6:
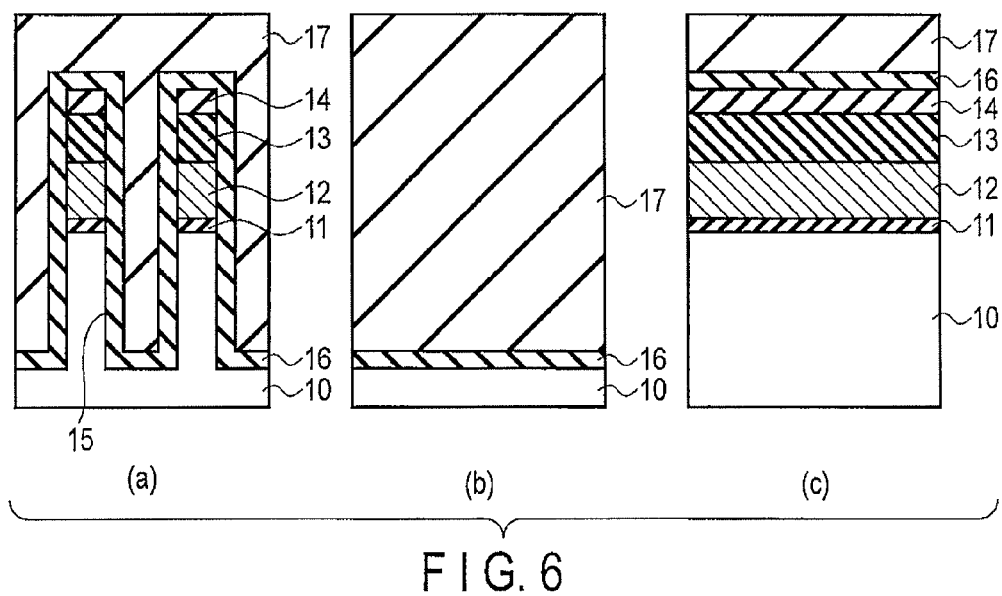
Figure 7:
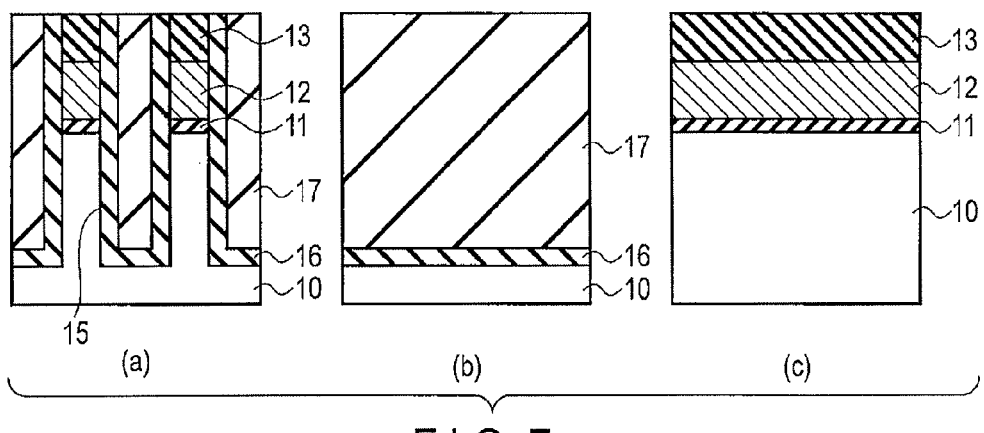
Figure 8:
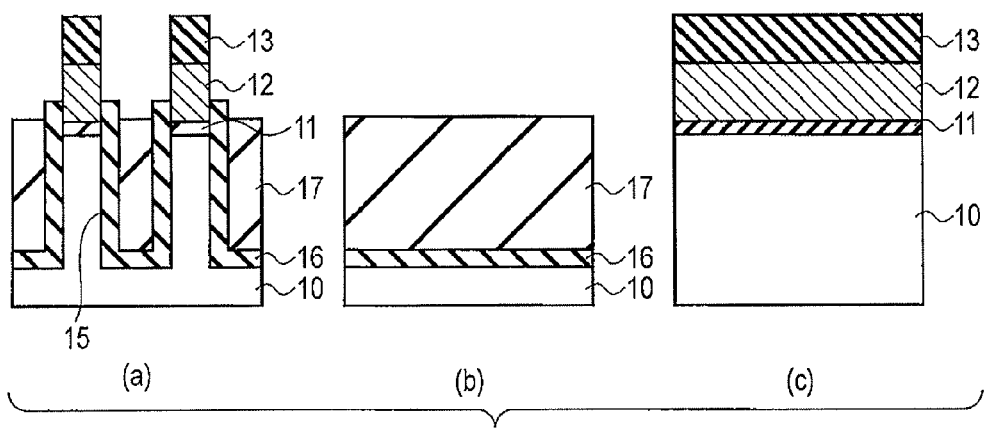

In general, according to one embodiment, a method of manufacturing a semiconductor device is provided. In the method for producing a semiconductor device, a tunnel insulating film is formed on a semiconductor layer. A first conductive film serving as a floating gate electrode is formed on the tunnel insulating film. A trench is formed by processing the first conductive film, the tunnel insulating film, and the semiconductor layer. A first sacrifice film is buried on a lower side in the trench. A second sacrifice film having density higher than that of the first sacrifice film is formed on the first sacrifice film in the trench such that an upper surface of the second sacrifice film is located higher than an upper surface of the tunnel insulating film while located lower than an upper surface of the first conductive. An insulating film is formed on the first conductive film and the second sacrifice film. A second conductive film serving as a control gate electrode is formed on the insulating film. The second sacrifice film is exposed by processing the second conductive film. The first sacrifice film and the second sacrifice film are removed.

Hereinafter, embodiments will be described below with reference to the drawings. In the drawings, the same component is designated by the same numeral, and the overlapping description is made as needed basis.

First Embodiment

A semiconductor device according to a first embodiment will be described with reference to FIGS. 1, 2, 3, 4, 5, 6, 7, 8, 9, 10, 11, 12, 13, 14, and 15. In the first embodiment, after an HSQ (hydrogen silsesquioxane) film 17 and an oxide film 18, which is located on the HSQ film 17 while having an etching resistance characteristic stronger than that of the HSQ film 17, are formed in a trench 15 that is provided as the STI, an air gap 20 is formed by removing the HSQ film 17 and the oxide film 18.

[Structure of First Embodiment]

A structure of the semiconductor device of the first embodiment will be described with reference to FIGS. 1 and 2.

FIG. 1 is a plan view illustrating the structure of the semiconductor device of the first embodiment.

Referring to FIG. 1, the semiconductor device includes plural bit lines BL and plural word lines WL orthogonal to the bit lines BL.

A memory cell MC is formed in each of intersection positions of the bit lines BL and the word lines WL. The memory cells MC are arrayed at predetermined intervals in a bit line direction and a word line direction orthogonal to the bit line direction. That is, the memory cells MC are two-dimensionally arrayed in the bit line direction and the word line direction.

The memory cells MC are formed in Active Areas (AA) along the bit line direction. The memory cells MC adjacent to each other along the word line direction are partitioned by an isolation area (STI) that is formed along the bit line direction.

FIG. 2 is a sectional view illustrating the structure of the semiconductor device of the first embodiment. More specifically, FIG. 2(a) is a sectional view taken on a line A-A of FIG. 1, FIG. 2(b) is a sectional view taken on a line B-B of FIG. 1, and FIG. 2(c) is a sectional view taken on a line C-C of FIG. 1. That is, FIG. 2(a) is a sectional view of the memory cell MC along the word line direction, FIG. 2(b) is a sectional view of the isolation area along the bit line direction, and FIG. 2(c) is a sectional view of the active area along the word line direction. At this point, the bit line BL is omitted in FIG. 2.

As illustrated in FIGS. 2(a), 2(b), and 2(c), on a semiconductor layer 10, the semiconductor device of the first embodiment includes the active area (AA) where the memory cell MC is formed and the isolation area that has the STI structure to partition the active area.

For example, the semiconductor layer 10 is constructed by a silicon substrate. Alternatively, the semiconductor layer 10 may be constructed by an SOI (Silicon On Insulating) substrate. The semiconductor layer 10 includes a step between the active area and the isolation area. More specifically, the semiconductor layer 10 includes an upper step surface in the active area and a lower step surface in the isolation area. That is, the semiconductor layer 10 includes the trench 15 in the isolation area. For example, the trench 15 has a width of 30 nm or less in the word line direction and a depth of 200 nm to 500 nm in a stacking direction. However, the trench 15 may properly have a different width and a different depth according to a device structure and a generation thereof.

The memory cell MC in the active area includes a tunnel insulating film 11 formed on the semiconductor layer 10, a floating gate electrode 12, an interelectrode insulating film 19, and the word line WL (control gate electrode).

In the active area, the tunnel insulating film 11 is formed on the semiconductor layer 10. For example, the tunnel insulating film 11 is constructed by a silicon oxide film, a silicon nitride film, or a stacked film thereof. For example, the tunnel insulating film 11 has a thickness of 8 nm or less.

The floating gate electrode 12 is formed on the tunnel insulating film 11. For example, the floating gate electrode 12 is constructed by a polysilicon film. Alternatively, the floating gate electrode 12 may be constructed by a W silicide film or a Co silicide film. For example, when the polysilicon film is used as the floating gate electrode 12, the floating gate electrode 12 has a thickness of 100 nm. On the other hand, when the W silicide film or the Co silicide film is used as the floating gate electrode 12, the floating gate electrode 12 has the thickness of 100 nm to 200 nm. The floating gate electrode 12 acts as a charge accumulation film.

The interelectrode insulating film 19 is formed on the floating gate electrode 12. That is, the interelectrode insulating film 19 is formed so as to cover the upper surface and upper side surface of the floating gate electrode 12. For example, the interelectrode insulating film 19 is constructed by a stacked film in which a silicon oxide film, a silicon nitride film, and a silicon oxide film are sequentially formed. However, the interelectrode insulating film 19 is not limited to the stacked film. The interelectrode insulating film 19 may be constructed by a single layer film including the silicon oxide film or the silicon nitride film, or a stacked film having at least four layers in which the silicon oxide films or the silicon nitride films are alternately formed. For example, the interelectrode insulating film 19 has the thickness of about 20 nm.

The control gate electrode serving as the word line WL is formed on the interelectrode insulating film 19. For example, the control gate electrode is constructed by a stacked film in which a polysilicon film and a W film are sequentially formed. However, the control gate electrode is not limited to the stacked film. The control gate electrode may be constructed by a single layer film including the polysilicon film or the W film, or the control gate electrode may be constructed by the W silicide film or the Co silicide film. For example, the control gate electrode has the thickness of about 50 nm.

On the other hand, in the isolation area, the STI structure is formed in the trench 15 formed in the semiconductor layer 10. As illustrated in FIG. 2(a), the STI structure is formed between the memory cells MC (between the floating gate electrodes 12) adjacent to each other in the word line direction, and extended in the bit line direction. The STI structure includes a liner film 16 and the air gap 20.

The liner film 16 is formed on an inner surface of the trench 15. That is, the liner film 16 is formed on the side surface and bottom surface of the semiconductor layer 10 in the trench 15, the side surface of the tunnel insulating film 11, and a lower side surface of the floating gate electrode 12. The liner film 16 formed on the lower side surface of the floating gate electrode 12 is in contact with the interelectrode insulating film 19 formed on the upper side surface of the floating gate electrode 12. For example, the liner film 16 is constructed by a TEOS film or an HTO film. For example, the liner film 16 has the thickness of 1 nm to 20 nm. The liner film 16 acts as a protective film that protects a sidewall of the STI structure.

The air gap 20 is formed on the liner film 16 in the trench 15. That is, the air gap 20 is formed on the bottom surface and side surface of the liner film 16 in the trench 15. As illustrated in FIGS. 2(a) and 2(b), the interelectrode insulating film 19 and an interlayer insulating film (not illustrated) are formed on the upper surface of the air gap 20. The side surface in the word line direction of the air gap 20 is covered with the liner film 19, and the upper surface is covered with the interelectrode insulating film 19 and the interlayer insulating film. The upper surface of the air gap 20 is higher than the upper surface of the tunnel insulating film 11 and is lower than the upper surface of the floating gate electrode 12. That is, the air gap 20 is formed in at least a portion between the floating gate electrodes 12 adjacent to each other. Desirably, in the area between the floating gate electrodes 12 adjacent to each other, an area where the air gap 20 is formed is enlarged as much as possible.

The air gap 20 is the cavity structure filled with, for example, air. The air gap 20 is formed between the memory cells MC (between the floating gate electrodes 12) adjacent to each other in the word line direction, which allows the insulating characteristic to be improved between the floating gate electrodes 12 to suppress the leak current.

In the first embodiment, the HSQ oxide film 17 may be formed below the air gap 20. That is, the HSQ oxide film 17 is formed on the bottom surface and lower-side side surface of the liner film 16 in the trench 15, and the air gap 20 is formed on the upper-side side surface of the liner film 16. The HSQ oxide film 17 is formed as the sacrifice film in the trench 15 through the producing process which will be described later, and remains in removing the sacrifice film.

The HSQ oxide film 17 includes many voids. Therefore, the HSQ oxide film 17 has density lower than that of a PHPS (perhydropolysilazane) oxide film or the silicon oxide film formed by a CVD method or an ALD (Atomic Layer Deposition) method which will be described later.

[Producing Method of First Embodiment]

A method for producing the semiconductor device of the first embodiment will be described with reference to FIGS. 3, 4, 5, 6, 7, 8, 9, 10, 11, 12, 13, 14, and 15.

FIGS. 3, 4, 5, 6, 7, 8, 9, 10, 11, 12, 13, 14, and 15 are sectional views illustrating the structure of the semiconductor device of the first embodiment. More specifically, FIGS. 3(a), 4(a), 5(a), 6(a), 7(a), 8(a), 9(a), 10(a), 11(a), 12(a), 13(a), 14(a), and 15(a) are sectional views taken on the line A-A of FIG. 1, FIGS. 3(b), 4(b), 5(b), 6(b), 7(b), 8(b), 9(b), 10(b), 11(b), 12(b), 13(b), 14(b), and 15(b) are sectional views taken on the line B-B of FIG. 1, and FIGS. 3(c), 4(c), 5(c), 6(c), 7(c), 8(c), 9(c), 10(c), 11(c), 12(c), 13(c), 14(c), and 15(c) are sectional views taken on the line C-C of FIG. 1.

As illustrated in FIGS. 3(a), 3(b), and 3(c), the tunnel insulating film 11 constructed by the silicon oxide film is formed on the semiconductor layer 10 by, for example, a thermal oxidation method. For example, the tunnel insulating film 11 may be constructed by the silicon oxide film or the silicon nitride film or the stacked film thereof, which is formed by the CVD method or the ALD method. For example, the tunnel insulating film 11 has the thickness of 8 nm or less.

The floating gate electrode 12 is formed on the tunnel insulating film 11 by, for example, the CVD method or the ALD method. For example, the floating gate electrode 12 is constructed by the polysilicon film having the thickness of 100 nm or the W silicide film or Co silicide film having the thickness of 100 nm to 200 nm.

A stopper film 13 is formed on the floating gate electrode 12 by, for example, an LP (Low Pressure) CVD method. For example, the stopper film 13 is constructed by the silicon nitride film having the thickness of 200 nm or the polysilicon film having the thickness of 100 nm to 200 nm.

Then a hard mask 14 is formed on the stopper film 13 by, for example, the LP-CVD method. For example, the hard mask 14 is constructed by a TEOS film having a thickness of 300 nm.

As illustrated in FIGS. 4(a), 4(b), and 4(c), the stopper film 13, the floating gate electrode film 12, the tunnel insulating film 11, and the semiconductor layer 10 are processed with the hard mask 14 as a mask by photolithography and a dry etching method. Therefore, the trench 15 is formed to the semiconductor layer 10 while piercing the stopper film 13, the floating gate electrode film 12, and the tunnel insulating film 11. For example, the trench 15 has the width of 30 nm or less and the depth of 200 nm to 500 nm in the semiconductor layer 10. However, the trench 15 may properly have a different width and a different depth according to a device structure and a generation thereof.

At this point, although the hard mask 14 is partially etched, the hard mask 14 is left on the stopper film 13.

As illustrated in FIGS. 5(a), 5(b), and 5(c), the liner film 16 is formed on the inner surface of the trench 15 by, for example, the CVD method. That is, the liner film 16 is formed on the side surface and bottom surface of the semiconductor layer 10 in the trench 15, the side surface of the tunnel insulating film 11, the side surface of the floating gate electrode 12, the side surface of the stopper film 13, the side surface of the hard mask 14, and the upper surface of the hard mask 14 outside of the trench 15. For example, the liner film 16 is constructed by the TEOS film or the HTO film. The liner film 16 may be constructed by the silicon oxide film that is formed by the ALD method. For example, the liner film 16 has the thickness of 1 nm to 20 nm.

The processes described above may be performed by various well-known methods.

Then a process of forming the air gap 20 as the STI structure is performed. The process of forming the air gap 20 of the first embodiment will be described in detail.

As illustrated in FIGS. 6(a), 6(b), and 6(c), the HSQ film 17 serving as the sacrifice film is formed on the liner film 16 by an application method such that the whole surface of the liner film 16 is covered with the HSQ film 17. That is, the HSQ film 17 is formed on the bottom surface and side surface of the liner film 16 in the trench 15 and the upper surface of the liner film 16 outside of the trench 15. Therefore, the HSQ film 17 is buried in the trench 15. The HSQ film 17 can be made thin by the application method, and the HSQ film 17 has an excellent burying characteristic. Therefore, the HSQ film 17 can be buried in the trench 15 even if the width of the trench 15 is narrowed.

Then the HSQ film 17 is oxidized to form the HSQ oxide film 17 by performing a heat treatment in an oxygen atmosphere or a water-vapor atmosphere. At this point, for example, the heat treatment is performed at a temperature of 230° C. to 900° C. The HSQ oxide film 17 may be hardened by performing the heat treatment in a nitrogen atmosphere.

As used herein, the HSQ oxide film 17 means an oxide film that is derived from the HSQ film 17. Hereinafter the HSQ oxide film 17 is simply referred to as an HSQ film 17.

The thus formed HSQ film 17 includes many voids. Therefore, the HSQ film 17 has density lower than that of a PHPS film or an oxide film that is formed by the CVD method or the ALD method which will be described later (low film density). The HSQ film 17 has an etching resistance characteristic weaker than that of the PHPS film or the oxide film that is formed by the CVD method or the ALD method (high etching rate).

As illustrated in FIGS. 7(a), 7(b), and 7(c), CMP (Chemical Mechanical Polishing) is performed with the stopper film 13 as a stopper. Therefore, the upper HSQ film 17, the upper liner film 16, and the hard mask 14 are removed to planarize the upper surfaces of the HSQ film 17, liner film 16, and stopper film 13.

As illustrated in FIGS. 8(a), 8(b), and 8(c), the HSQ film 17 is etched. At this point, the HSQ film 17 is processed such that the upper surface of the HSQ film 17 ranges from the upper surface to the lower surface of the tunnel insulating film 11. However, the upper surface of the HSQ film 17 is not limited to the range of the upper surface to the lower surface of the tunnel insulating film 11. In consideration of a process of removing the HSQ film 17 which will be described later, desirably the HSQ film 17 is processed such that the upper surface of the HSQ film 17 is located higher than the upper surface of the tunnel insulating film 11. That is, the lower side in the trench 15 is filled with the HSQ film 17.

At this point, the liner film 16 may simultaneously be etched. That is, the side surfaces of the stopper film 13 and floating gate electrode 12 may be exposed. The liner film 16 has the etching resistance characteristic stronger than that of the HSQ film 17. Therefore, the upper surface of the liner film 16 is processed so as to be higher than the upper surface of the HSQ film 17.

The etching may be either wet etching or dry etching, and be either isotropic or anisotropic. In the case of the wet etching, for example, a DHF (dilute hydrofluoric acid) is used as an etching solution.

As illustrated in FIGS. 9(a), 9(b), and 9(c), the oxide film 18 serving as the sacrifice film is formed so as to cover the whole surface. That is, the oxide film 18 is formed on the upper surface of the HSQ film 17 in the trench 15, the upper surface and side surface of the liner film 16, the side surface of the floating gate electrode 12, the side surface of the stopper film 13, and the upper surface of the stopper film 13 outside of the trench 15. Therefore, the upper side in the trench 15 is filled with the oxide film 18.

For example, the oxide film 18 may be constructed by the silicon oxide film that is formed by the CVD method or the ALD method. From the viewpoint of the burying characteristic, desirably the oxide film 18 is constructed by the PHPS film that is formed by the application method. In the case that the PHPS film is formed as the oxide film 18, the PHPS film is formed as follows.

The PHPS film is buried in the trench 15 by the application method. The PHPS film can be made thin by the application method, and the PHPS film has the excellent burying characteristic. Therefore, the PHPS film can be buried in the trench 15 even if the width of the trench 15 is narrowed. Then the PHPS film is oxidized to form the PHPS oxide film by performing the heat treatment in the oxygen atmosphere or the water-vapor atmosphere. In the case that the floating gate electrode 12, the tunnel insulating film 11, and the semiconductor layer 10 are not covered with the liner film 16, the heat treatment is performed at a relatively low temperature of, for example, 230° C. to 500° C. in order to prevent the oxidation of the floating gate electrode 12, the tunnel insulating film 11, and the semiconductor layer 10. The PHPS film may be hardened by performing the heat treatment in the nitrogen atmosphere. Thus, the PHPS film having the excellent burying characteristic is formed.

The thus formed oxide film 18 (the silicon oxide film or the PHPS oxide film) has density higher than that of the HSQ film 17 that is located below the oxide film 18 (high film density). The oxide film 18 has the etching resistance characteristic stronger than that of the HSQ film 17 (low etching rate).

As illustrated in FIGS. 10(a), 10(b), and 10(c), the CMP is performed with the stopper film 13 as the stopper. Therefore, the upper oxide film 18 is removed to planarize the upper surfaces of the oxide film 18 and stopper film 13.

As illustrated in FIGS. 11(a), 11(b), and 11(c), the oxide film 18 is etched. At this point, the oxide film 18 is processed such that the upper surface of the oxide film 18 is located higher than the upper surface of the tunnel insulating film 11 while located lower than the upper surface of the floating gate electrode 12. That is, desirably the oxide film 18 is processed so as to be located in a lateral of the floating gate electrode 12. The upper surface of the oxide film 18 may be higher than the upper surface of the liner film 16. That is, the liner film 16 may be covered with the oxide film 18. Desirably the oxide film 18 formed in the trench 15 is minimized to an extent to which uniformity of a surface shape or height of the oxide film 18 is obtained.

The etching may be either the wet etching or the dry etching, and be either isotropic or anisotropic. In the case of the wet etching, for example, the DHF (dilute hydrofluoric acid) is used as the etching solution.

As illustrated in FIGS. 12(a), 12(b), and 12(c), for example, the stopper film 13 is removed by the wet etching using a phosphoric acid aqueous solution. Therefore, the upper surface of the floating gate electrode 12 is exposed.

As illustrated in FIGS. 13(a), 13(b), and 13(c), for example, the interelectrode insulating film 19 is formed on the floating gate electrode 12 by the CVD method. For example, the interelectrode insulating film 19 is constructed by the stacked film in which the silicon oxide film, the silicon nitride film, and the silicon oxide film are sequentially formed. However, the interelectrode insulating film 19 is not limited to the stacked film. The interelectrode insulating film 19 may be constructed by the single layer film including the silicon oxide film or the silicon nitride film, or the stacked film having at least four layers in which the silicon oxide films or the silicon nitride films are alternately formed. For example, the interelectrode insulating film 19 has the thickness of about 20 nm.

At this point, the interelectrode insulating film 19 is also formed on the oxide film 18. In other words, the oxide film 18 is covered with the interelectrode insulating film 19. The oxide film 18 is a film in which density is higher than that of the HSQ film 17. For this reason, among the plural trenches 15, the surface shape or height of the oxide film 18 can be uniformed. Therefore, the thickness and structure of the interelectrode insulating film 19 can uniformly be formed.

As illustrated in FIGS. 14(a), 14(b), and 14(c), for example, the control gate electrode serving as the word line WL is formed on the floating gate electrode 12 by the CVD method. For example, the control gate electrode is constructed by the stacked film in which the polysilicon film and the W film are sequentially formed. However, the control gate electrode is not limited to the stacked film. The control gate electrode may be constructed by the single layer film including the polysilicon film or the W film, or the control gate electrode may be constructed by the W silicide film or the Co silicide film. For example, the control gate electrode has the thickness of about 50 nm.

As illustrated in FIGS. 15(a), 15(b), and 15(c), the word line WL is processed along the bit line direction by the photolithography and the dry etching method. At this point, the etching is performed to the tunnel insulating film 11. That is, each layer located above the tunnel insulating film 11 is processed. More specifically, the word line WL, the interelectrode insulating film 19, and the floating gate electrode 12 are processed.

Figure 15:
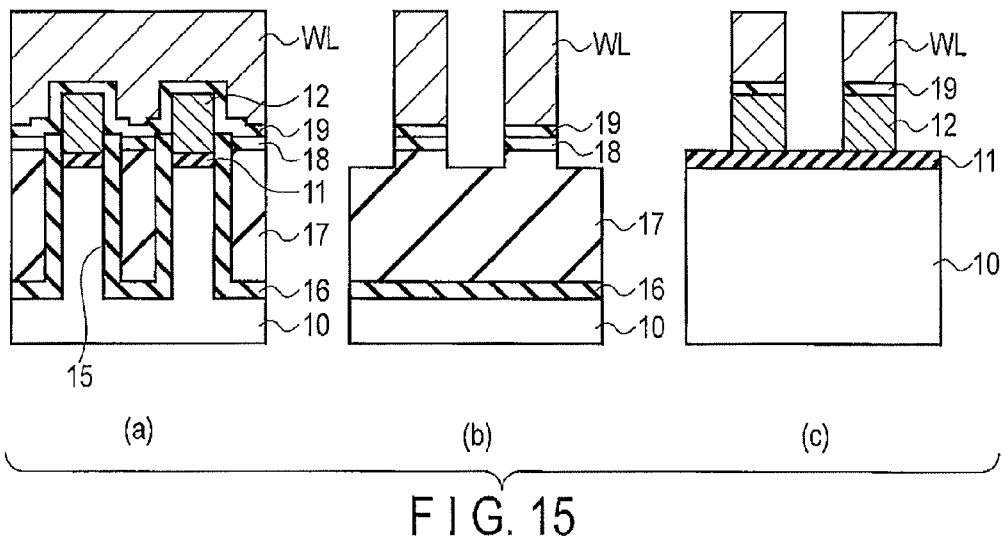

At this point, in the preceding process, at least part of the oxide film 18 is located higher than the tunnel insulating film 11. Therefore, the part of the oxide film 18 is simultaneously processed and exposed. In FIG. 15, part of the HSQ film 17 is also located higher than the tunnel insulating film 11. For this reason, the etching is performed to the part of the HSQ film 17 while piercing the oxide film 18. Therefore, the oxide film 18 and the HSQ film 17 are partially exposed.

As illustrated in FIGS. 2(a), 2(b), and 2(c), the HSQ film 17 and the oxide film 18 are removed by, for example, the isotropic wet etching. For example, the DHF is used as the etching solution. Therefore, the air gap 20 is formed on the liner film 16 in the trench 15.

At this point, the HSQ film 17 and the oxide film 18 are removed from the exposed surfaces of the oxide film 18 and HSQ film 17. In the case that the HSQ film 17 is not exposed, the HSQ film 17 can be removed after the oxide film 18 having the strong etching resistance characteristic is removed. Therefore, it is relatively difficult to remove the HSQ film 17. For this reason, desirably not only the surfaces of not only the oxide film 18 but also the HSQ film 17 are exposed in the preceding process.

The HSQ film 17 is removed from the upper side, but it is not necessary to completely remove the HSQ film 17. The HSQ film 17 may be removed to an extent to which the Yupin/Enda effect can be suppressed between the floating gate electrodes 12 adjacent to each other. At this point, although the liner film 16 is also removed, the liner film 16 may remain.

Then the interlayer insulating film (not illustrated) constructed by, for example, the TEOS film is formed over the whole surface by the CVD method. The interlayer insulating film is not formed in the air gap 20, because the interlayer insulating film is formed by a method, such as the CVD method, in which the low burying characteristic is obtained.

As described above, the air gap 20 is formed in the semiconductor device of the first embodiment.

Advantageous Effect of First Embodiment

According to the first embodiment, after the HSQ film 17 having the low film density and the weak etching resistance characteristic is formed as the sacrifice film in the trench 15 that is provided as the STI, the oxide film 18 having the film density higher than that of the HSQ film 17 and the etching resistance characteristic stronger than that of the HSQ film 17 is formed on the HSQ film 17. Then, after the oxide film 18 and the HSQ film 17 are covered with the interelectrode insulating film 19 and the word line WL, the air gap 20 is formed as the STI structure by partially exposing and removing the oxide film 18 and the HSQ film 17.

The HSQ film 17 having the low film density and the weak etching resistance characteristic is used as the sacrifice film, which allows the easy removal of the sacrifice film. That is, solubility of the sacrifice film in the etching solution can be improved to form a large cavity serving as the air gap 20. Accordingly, the Yupin/Enda effect can be reduced between the floating gate electrodes 12 adjacent to each other to improve the device characteristic.

According to the first embodiment, as the sacrifice film, not only the HSQ film 17 is formed but also the oxide film 18 is formed on the HSQ film 17 The oxide film 18 has the etching resistance characteristic stronger than that of the HSQ film 17 and the film density higher than that of the HSQ film 17. For this reason, the uniformity of the surface shape and height of the oxide film 18 can be achieved in the plural trenches 15. That is, the thickness and structure of the interelectrode insulating film 19 formed on the oxide film 18 can be uniformed to improve reliability of the device.

Second Embodiment

A semiconductor device according to a second embodiment will be described with reference to FIGS. 16, 17, 18, and 19. In the second embodiment, a PHPS film 21 is formed as an oxide film 18 of the first embodiment, and a surface of a floating gate electrode 12 is covered with a liner film 16 in a process of forming the PHPS film 21. In the second embodiment, the description of the same constituent as the first embodiment is omitted, and a different point is mainly described.

[Producing Method of Second Embodiment]

A method for producing the semiconductor device of the second embodiment will be described with reference to FIGS. 16, 17, 18, and 19.

FIGS. 16, 17, 18, and 19 are sectional views illustrating a process of producing the semiconductor device of the second embodiment. More specifically, FIGS. 16(*a*), 17(*a*), 18(*a*), and 19(*a*) are sectional views taken on the line A-A of FIG. 1, FIGS. 16(*b*), 17(*b*), 18(*b*), and 19(*b*) are sectional views taken on the line B-B of FIG. 1, and FIGS. 16(*c*), 17(*c*), 18(*c*), and 19(*c*) are sectional views taken on the line C-C of FIG. 1.

Similarly to the first embodiment, the processes in FIGS. 3, 4, 5, 6, and 7 are performed. That is, upper surfaces of an HSQ film 17, the liner film 16, and a stopper film 13 are planarized, after the HSQ film 17 is formed so as to cover a trench 15.

Figure 16:
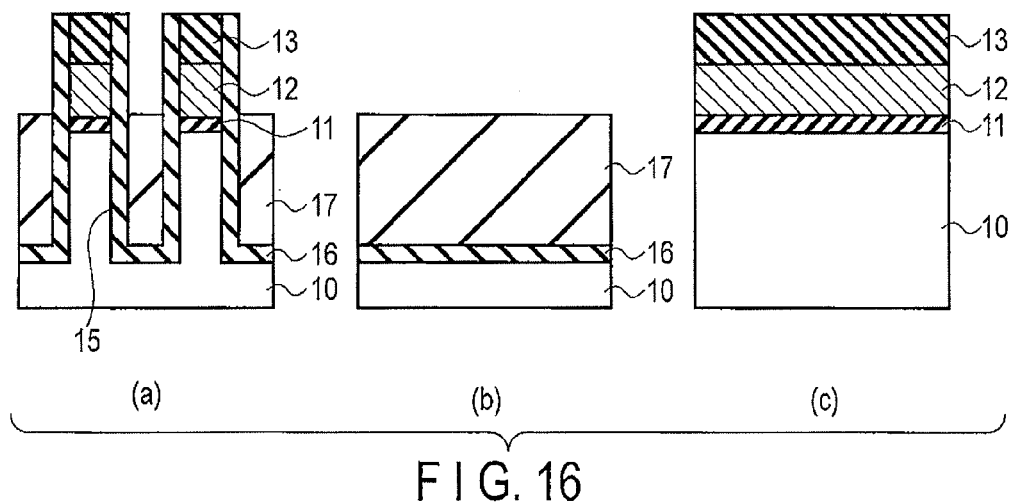

As illustrated in FIGS. 16(*a*), 16(*b*), and 16(*c*), the HSQ film 17 is etched. At this point, the HSQ film 17 is processed such that the upper surface of the HSQ film 17 ranges from the upper surface to the lower surface of a tunnel insulating film 11. However, the upper surface of the HSQ film 17 is not limited to the range of the upper surface to the lower surface of the tunnel insulating film 11. In consideration of the process of removing the HSQ film 17 which will be described later, desirably the HSQ film 17 is processed such that the upper surface of the HSQ film 17 is located higher than the upper surface of the tunnel insulating film 11.

At this point, in the second embodiment, the liner film 16 is not etched. That is, an etching condition is adjusted such that the side surfaces of the stopper film 13 and floating gate electrode 12 are not exposed while remaining covered with the liner film 16.

The wet etching in which an alkali solution is used as the etching solution can be cited as an example of the etching condition. In the HSQ film 17, the etching resistance characteristic against the alkali solution is weaker than that of the liner film 16. Therefore, only the HSQ film 17 can be etched by wet etching using the alkali solution.

Figure 17:
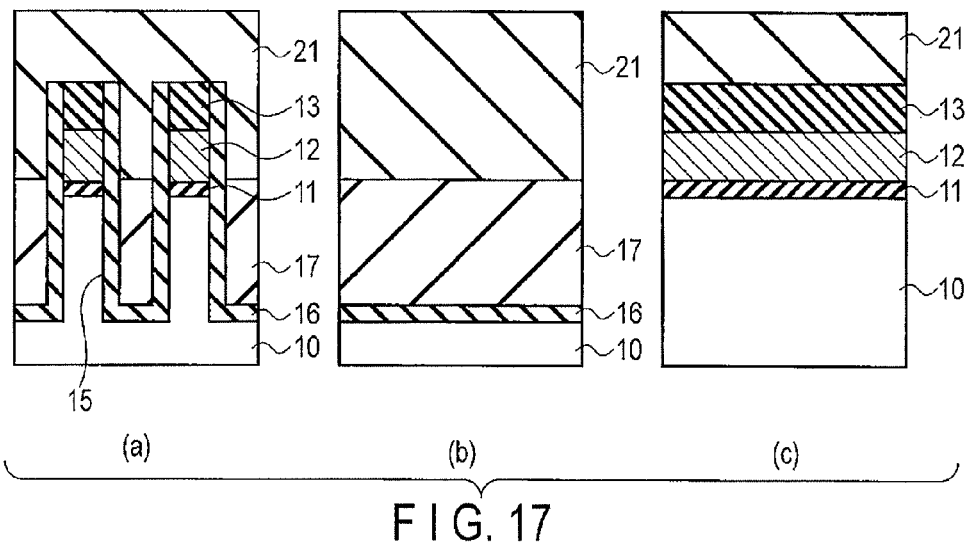

As illustrated in FIGS. 17(*a*), 17(*b*), and 17(*c*), the PHPS film 21 serving as the sacrifice film is formed by the application method so as to cover the whole surface. That is, the PHPS film 21 is formed on the upper surface of the HSQ film 17 in the trench 15, the side surface of the liner film 16, the upper surface of the liner film 16 outside of the trench 15, and the upper surface of the stopper film 13. Therefore, the upper side in the trench 15 is filled with the PHPS film 21.

Then the PHPS film 21 is oxidized to form the PHPS oxide film 21 by performing the heat treatment in the oxygen atmosphere or the water-vapor atmosphere.

As used herein, the PHPS oxide film 21 means an oxide film that is derived from the PHPS film 21. Hereinafter the PHPS oxide film 21 is simply referred to as a PHPS film 21.

At this point, for example, the heat treatment is performed at the temperature of 230° C. to 900° C. In the second embodiment, the floating gate electrode 12, the tunnel insulating film 11, and a semiconductor layer 10 are covered with the liner film 16. Therefore, even if the process (heat treatment) of oxidizing the PHPS film 21 is performed at a relatively high temperature, the floating gate electrode 12, the tunnel insulating film 11, and the semiconductor layer 10 are not oxidized.

Figure 18:
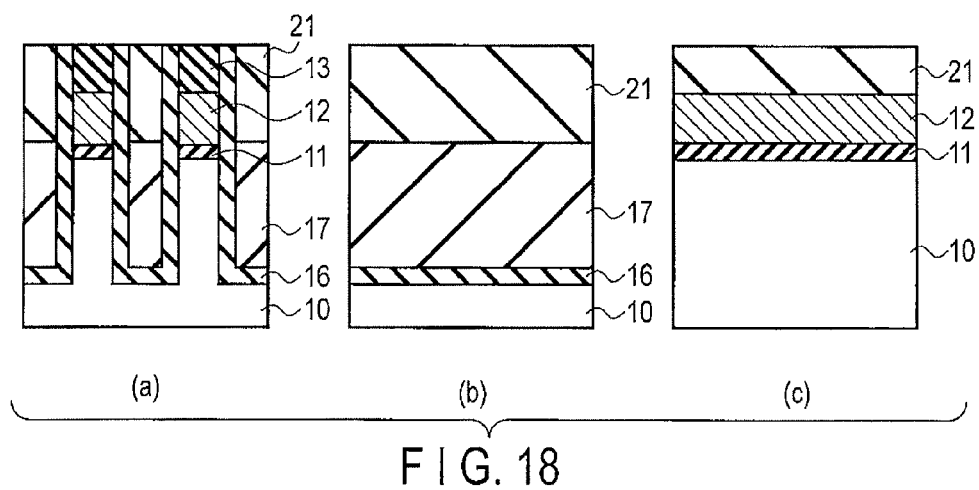
Figure 23:
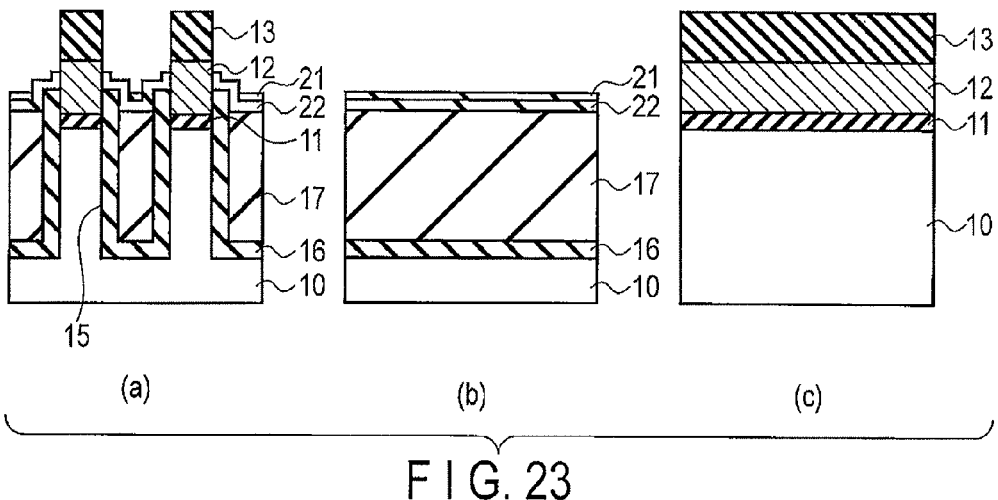
Figure 24:
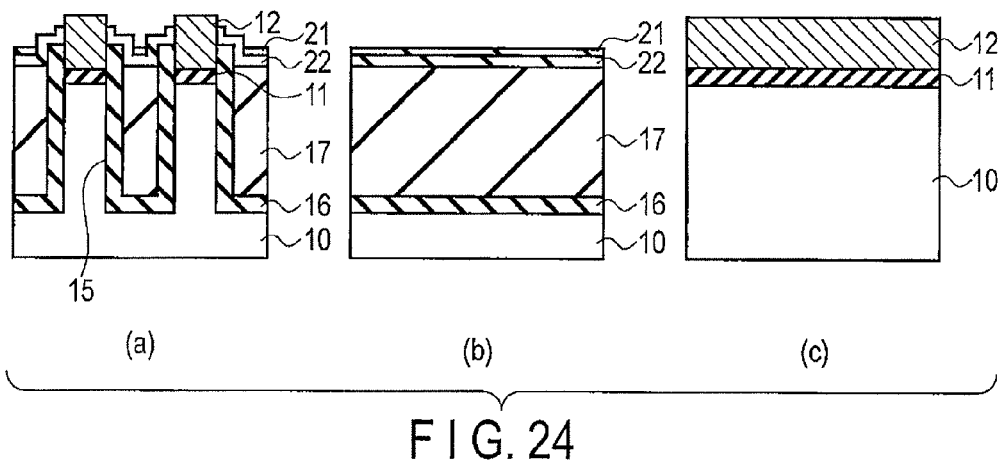
Figure 25:
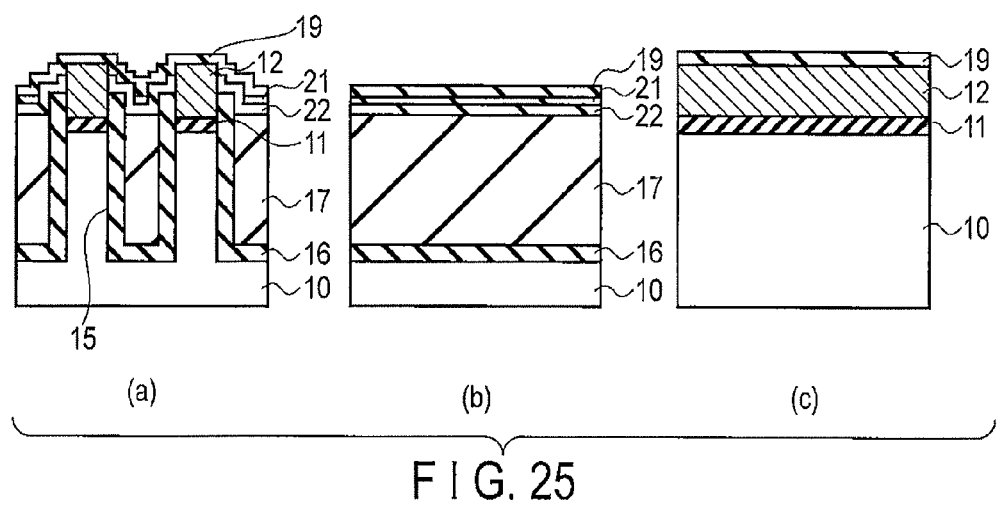
Figure 26:
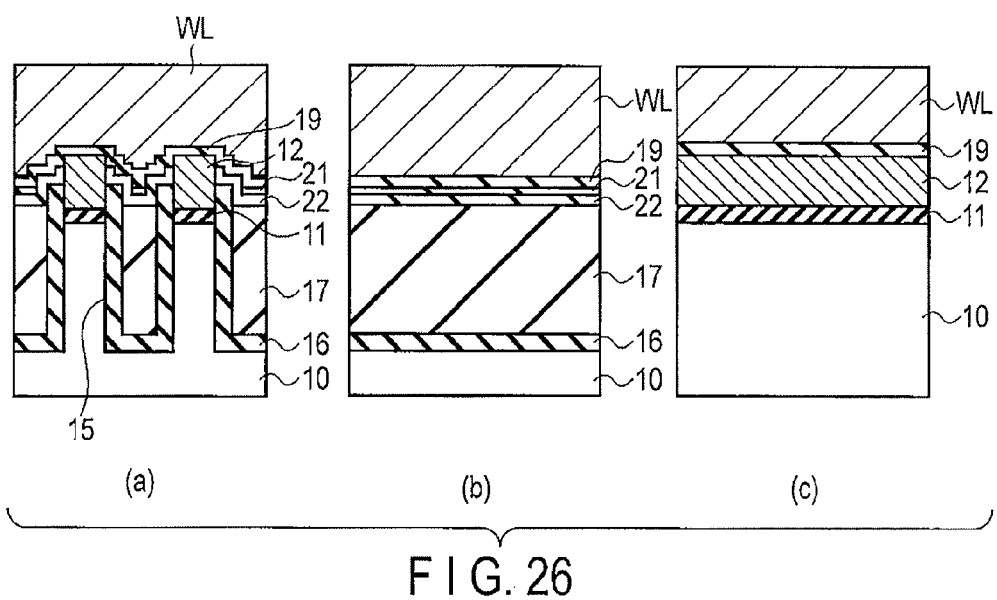
Figure 27:
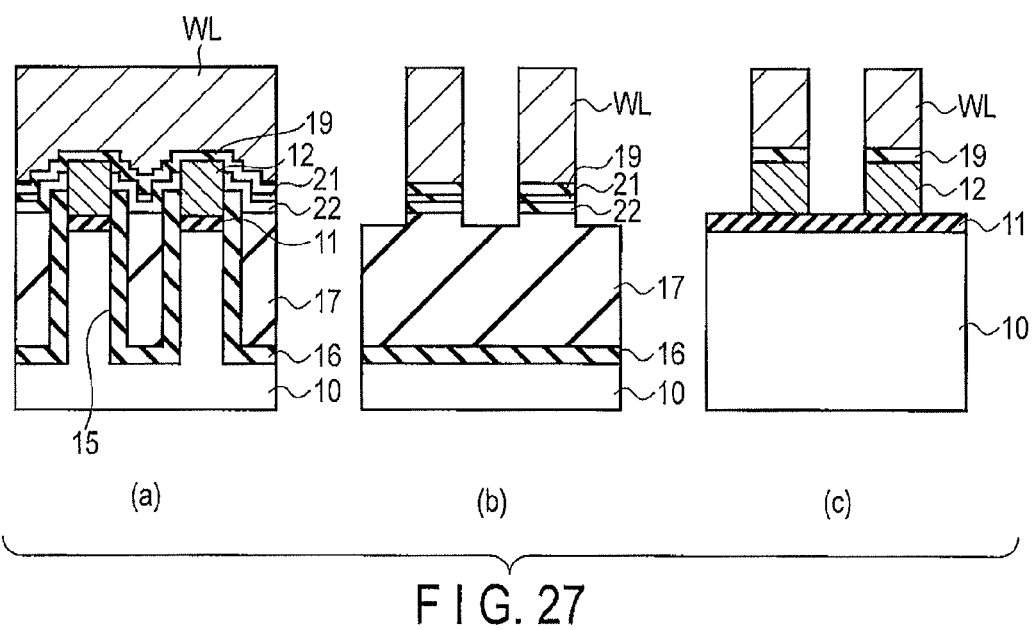

As illustrated in FIGS. 18(*a*), 18(*b*), and 18(*c*), the CMP is performed with the stopper film 13 as the stopper. Therefore, the upper PHPS film 21 is removed to planarize the upper surfaces of the PHPS film 21, liner film 16, and stopper film 13.

As illustrated in FIGS. 19(*a*), 19(*b*), and 19(*c*), the PHPS film 21 is etched. At this point, the PHPS film 21 is processed such that the upper surface of the PHPS film 21 ranges from the upper surface to the lower surface of the tunnel insulating film 11. That is, desirably the PHPS film 21 is processed so as to be located in the lateral of the floating gate electrode 12.

At this point, the liner film 16 is simultaneously formed. That is, the side surfaces of the stopper film 13 and floating gate electrode 12 are exposed.

The etching may be either the wet etching or the dry etching, and be either isotropic or anisotropic.

Then, the processes in FIGS. 12, 13, 14 and 15, and 2 are performed similarly to the first embodiment, and the air gap 20 is formed in the semiconductor device of the second embodiment.

Advantageous Effect of Second Embodiment

According to the second embodiment, the same advantage effect as the first embodiment can be obtained.

Additionally, in the second embodiment, when the etching is performed after the trench 15 is filled with the HSQ film 17, the etching condition is adjusted so as not to remove the liner film 16. Therefore, the process of applying the PHPS film 21 and the process of oxidizing the PHPS film 21 can be performed while the side surfaces of the floating gate electrode 12, tunnel insulating film 11, and semiconductor layer 10 are covered with the liner film 16. That is, the oxidation of the floating gate electrode 12, tunnel insulating film 11, and semiconductor layer 10 can be suppressed through the heat treatment in the process of oxidizing the PHPS film 21.

Third Embodiment

A semiconductor device according to a third embodiment will be described with reference to FIGS. 20, 21, 22, 23, 24, 25, 26, and 27. In the third embodiment, a PHPS film 21 is formed as an oxide film 18 of the first embodiment, and a high-density silicon oxide film 22 is formed between a HSQ film 17 and the PHPS film 21. In the third embodiment, the description of the same constituent as the above embodiments is omitted, and a different point is mainly described.

[Producing Method of Third Embodiment]

A method for producing the semiconductor device of the third embodiment will be described with reference to FIGS. 20, 21, 22, 23, 24, 25, 26, and 27.

FIGS. 20, 21, 22, 23, 24, 25, 26, and 27 are sectional views illustrating a process of producing the semiconductor device of the third embodiment. More specifically, FIGS. 20(a), 21(a), 22(a), 23(a), 24(a), 25(a), 26(a), and 27(a) are sectional views taken on the line A-A of FIG. 1, FIGS. 20(b), 21(b), 22(b), 23(b), 24(b), 25(b), 26(b), and 27(b) are sectional views taken on the line B-B of FIG. 1, and FIGS. 20(c), 21(c), 22(c), 23(c), 24(c), 25(c), 26(c), and 27(c) are sectional views taken on the line C-C of FIG. 1.

Similarly to the first embodiment, the processes in FIGS. 3, 4, 5, 6, 7 and 8 are performed. That is, after the HSQ film 17 is formed so as to cover a trench 15, the HSQ film 17 is buried in the lower side of the trench 15 by the etching.

As illustrated in FIGS. 20(a), 20(b), and 20(c), the silicon oxide film 22 is formed on the HSQ film 17 by the ALD method or the CVD method. That is, the silicon oxide film 22 is formed on the upper surface of the HSQ film 17 in the trench 15. Therefore, the upper surface of the HSQ film 17 is covered with the silicon oxide film 22.

At this point, the silicon oxide film 22 is formed over the surfaces of the films except the HSQ film 17. That is, the silicon oxide film 22 is also formed on the upper surface and side surface of a liner film 16 in the trench 15, the side surface of a floating gate electrode 12, the side surface of a stopper film 13, and the upper surface of the stopper film 13 outside of the trench 15.

As used herein, the silicon oxide film 22 that is of the sacrifice film means an oxide film that is formed by not the application method but the deposition method such as the CVD method and the ALD method.

For example, the silicon oxide film 22 has the thickness of 3 nm or less. However, the thickness of the silicon oxide film 22 is not limited thereto, and it may be large to an extent to which the PHPS film 21 does not invade in a void of the HSQ film in the subsequent process and be small to an extent to which the silicon oxide film 22 is easily etched as the sacrifice film.

The thus formed silicon oxide film 22 has the density higher than that of the HSQ film 17 located below the silicon oxide film 22 and the PHPS film 21 formed later on the silicon oxide film 22. The silicon oxide film 22 has the etching resistance characteristic stronger than that or HSQ film 17 and PHPS film 21.

The silicon oxide film 22 has the same effect as the liner film 16. That is, the floating gate electrode 12 is covered with the silicon oxide film 22 in a process of oxidizing the PHPS film 21 which will be described later, which allows the suppression of the oxidation of the floating gate electrode 12. Although desirably the silicon oxide film 22 is left on the surface of the floating gate electrode 12 from the viewpoint of the suppression of the oxidation of the floating gate electrode 12, the silicon oxide film 22 may be removed.

As illustrated in FIGS. 21(a), 21(b), and 21(c), the PHPS film 21 serving as the sacrifice film is formed by the application method so as to cover the whole surface. That is, the PHPS film 21 is formed on the upper surface of the silicon oxide film 22 in the trench 15, the side surface of the liner film 16, the upper surface of the liner film 16 outside of the trench 15, and the upper surface of the stopper film 13. Therefore, the PHPS film 21 is buried in the upper side of the trench 15.

The PHPS film 21 is oxidized by performing the heat treatment in the oxygen atmosphere or the water-vapor atmosphere. For example, the heat treatment is performed at the temperature of 230° C. to 500° C. in the case that the floating gate electrode 12 and the tunnel insulating film 11 are not covered with the liner film 16 (and/or silicon oxide film 22), and the heat treatment is performed at the temperature of 230° C. to 900° C. in the case that the floating gate electrode 12 and the tunnel insulating film 11 are covered with the liner film 16.

The thus formed PHPS film 21 has the density that is lower than that of the silicon oxide film 22 located below the PHPS film 21 and higher than that of the HSQ film located below the silicon oxide film 22. The oxide film 18 has the etching resistance characteristic that is weaker than that of the silicon oxide film 22 and stronger than that of the HSQ film 17.

As illustrated in FIGS. 22(a), 22(b), and 22(c), the CMP is performed with the stopper film 13 as the stopper. Therefore, the upper PHPS film 21 is removed to planarize the upper surfaces of the PHPS film 21, silicon oxide film 22, and stopper film 13.

As illustrated in FIGS. 23(a), 23(b), and 23(c), the PHPS film 21 is etched. At this point, the PHPS film 21 is processed such that the upper surface of the PHPS film 21 is located higher than the upper surface of the tunnel insulating film 11 while located lower than the upper surface of the floating gate electrode 12. That is, desirably the PHPS film 21 is processed so as to be located in the lateral of the floating gate electrode 12.

At this point, the silicon oxide film 22 is also etched. Although desirably the silicon oxide film 22 is removed from the side surface of the floating gate electrode 12, the silicon oxide film 22 may remain partially.

The etching may be either the wet etching or the dry etching, and be either isotropic or anisotropic.

As illustrated in FIGS. 24(a), 24(b), and 24(c), the stopper film 13 is removed by the wet etching using a phosphoric acid aqueous solution. Therefore, the upper surface of the floating gate electrode 12 is exposed.

As illustrated in FIGS. 25(a), 25(b), and 25(c), the interelectrode insulating film 19 is formed on the floating gate electrode 12 by, for example, the CVD method. At this point, the interelectrode insulating film 19 is also formed on the PHPS film 21.

As illustrated in FIGS. 26(a), 26(b), and 26(c), the control gate electrode serving as the word line WL is formed on the floating gate electrode 12 by, for example, the CVD method.

As illustrated in FIGS. 27(a), 27(b), and 27(c), the word line WL is processed along the bit line direction by the photolithography and the dry etching method. At this point, the etching is performed to the tunnel insulating film 11.

At this point, in the preceding process, at least part of the PHPS film 21 is located higher than the tunnel insulating film 11. Therefore, the part of the PHPS film 21 is simultaneously processed and exposed. In FIG. 15, the silicon oxide film 22 and the HSQ film 17 is also partially located higher than the tunnel insulating film 11. For this reason, the etching is performed to the part of the HSQ film 17 while piercing the silicon oxide film 22 and the HSQ film 17. Therefore, the PHPS film 21, the silicon oxide film 22, and the HSQ film 17 are partially exposed.

As illustrated in FIGS. 2(a), 2(b), and 2(c), for example, the HSQ film 17 and the PHPS film 21 are removed by the isotropic wet etching. For example, the DHF is used as the etching solution. Therefore, the air gap 20 is formed on the liner film 16 in the trench 15.

At this point, the silicon oxide film 22 has the etching resistance characteristic stronger than that of the HSQ film 17 and PHPS film 21. However, because the silicon oxide film 22 is formed thin (for example, 3 nm or less), the silicon oxide film 22 acts as the sacrifice film, and the silicon oxide film 22 is etched and removed at the same time as the HSQ film 17 and the PHPS film 21 are etched.

As described above, the air gap 20 is formed in the semiconductor device of the third embodiment.

Advantageous Effect of Third Embodiment

According to the third embodiment, the same advantage effect as the first embodiment can be obtained.

Because the HSQ film 17 includes many voids, the HSQ film 17 is the low-density film. In the case that the PHPS film 21 is formed on the HSQ film 17 by the application method, there is a risk that the PHPS film 21 having the high burying characteristic invades in the void of the HSQ film 17. The HSQ film 17 in which the PHPS film 21 invades becomes the high-density, strong-etching-resistance-characteristic film. As a result, the HSQ film 17 in which the PHPS film 21 invades is hardly removed as the sacrifice film in order to form the air gap 20.

On the other hand, in the third embodiment, the thin silicon oxide film 22 is formed at an interface between the HSQ film 17 and the PHPS film 21. The silicon oxide film 22 is the high-density, low-burying-characteristic film that is formed by the ALD method or the CVD method. The silicon oxide film 22 hardly invades in the void of the HSQ film 17 because of the low burying characteristic, and the silicon oxide film 22 can prevent the PHPS film 21 from invading in the HSQ film 17 because of the high-density film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device comprising:
    forming a tunnel insulating film on a semiconductor layer;
    forming a first conductive film serving as a floating gate electrode on the tunnel insulating film;
    forming a trench by processing the first conductive film, the tunnel insulating film, and the semiconductor layer;
    burying a first sacrifice film in a lower side in the trench;
    forming, after burying the first sacrifice film, a second sacrifice film having density higher than that of the first sacrifice film on the first sacrifice film in the trench such that an upper surface of the second sacrifice film is located higher than an upper surface of the tunnel insulating film while located lower than an upper surface of the first conductive film;
    forming an insulating film on the first conductive film and the second sacrifice film;
    forming a second conductive film serving as a control gate electrode on the insulating film;
    exposing the second sacrifice film by processing the second conductive film; and
    removing the first sacrifice film and the second sacrifice film at the same time to form an air gap in the trench under the insulating film.

2. The method of claim 1, wherein the first sacrifice film comprises an HSQ film that is formed by an application method.

3. The method of claim 2, wherein the second sacrifice film comprises a PHPS film that is formed by the application method.

4. The method of claim 2, wherein the second sacrifice film comprises a silicon oxide film that is formed by one of a CVD method and an ALD method.

5. The method of claim 1, further comprising forming a third sacrifice film, which comprises a silicon oxide film formed by one of a CVD method and an ALD method, on the first sacrifice film after burying the first sacrifice film,
    wherein the first sacrifice film comprises an HSQ film that is formed by an application method, and the second sacrifice film comprises a PHPS film that is formed by the application method.

6. The method of claim 1, wherein in burying the first sacrifice film, an upper surface of the first sacrifice film is located higher than the upper surface of the tunnel insulating film while located lower than the upper surface of the first conductive film, and
    in exposing the second sacrifice film, the first sacrifice film is also exposed.

7. The method of claim 1, further comprising forming a liner film such that the first conductive film, the tunnel insulating film, and the semiconductor layer are covered with the liner film, after forming the trench.

8. The method of claim 7, wherein the liner film comprises one of a TEOS film, an HTO film, and a silicon oxide film that is formed by an ALD method.

9. The method of claim 2, wherein the HSQ film is subjected to a heat treatment in one of an oxygen atmosphere and a water-vapor atmosphere.

10. The method of claim 3, wherein the PHPS film is subjected to a heat treatment in one of an oxygen atmosphere and a water-vapor atmosphere.

11. The method of claim 1, wherein the first sacrifice film and the second sacrifice film are removed after forming the insulating film.

12. The method of claim 1, wherein the second sacrifice film is completely removed.

13. A method of manufacturing a semiconductor device comprising:
    forming a tunnel insulating film on a semiconductor layer;
    forming a first conductive film serving as a floating gate electrode on the tunnel insulating film;
    forming a trench by processing the first conductive film, the tunnel insulating film, and the semiconductor layer;
    burying a first sacrifice film in a lower side in the trench;
    forming, after burying the first sacrifice film, a second sacrifice film having an etching resistance characteristic stronger than that of the first sacrifice film on the first sacrifice film in the trench such that an upper surface of the second sacrifice film is located higher than an upper surface of the tunnel insulating film while located lower than an upper surface of the first conductive film;
    forming an insulating film on the first conductive film and the second sacrifice film;
    forming a second conductive film serving as a control gate electrode on the insulating film;

exposing the second sacrifice film by processing the second conductive film; and removing the first sacrifice film and the second sacrifice film at the same time to form an air gap in the trench under the insulating film.

14. The method of claim 13, wherein the first sacrifice film comprises an HSQ film that is formed by an application method.

15. The method of claim 14, wherein the second sacrifice film comprises a PHPS film that is formed by the application method.

16. The method of claim 14, wherein the second sacrifice film comprises a silicon oxide film that is formed by one of a CVD method and an ALD method.

17. The method of claim 13, further comprising forming a third sacrifice film, which comprises a silicon oxide film formed by one of a CVD method and an ALD method, on the first sacrifice film after burying the first sacrifice film, wherein the first sacrifice film comprises an HSQ film that is formed by an application method, and the second sacrifice film comprises a PHPS film that is formed by the application method.

18. The method of claim 13, wherein in burying the first sacrifice film, an upper surface of the first sacrifice film is located higher than the upper surface of the tunnel insulating film while located lower than the upper surface of the first conductive film, and in exposing the second sacrifice film, the first sacrifice film is also exposed.

19. The method of claim 13, further comprising forming a liner film such that the first conductive film, the tunnel insulating film, and the semiconductor layer are covered with the liner film, after forming the trench.

20. The method of claim 19, wherein the liner film comprises one of a TEOS film, an HTO film, and a silicon oxide film that is formed by an ALD method.

21. The method of claim 14, wherein the HSQ film is subjected to a heat treatment in one of an oxygen atmosphere and a water-vapor atmosphere.

22. The method of claim 15, wherein the PHPS film is subjected to a heat treatment in one of an oxygen atmosphere and a water-vapor atmosphere.

23. The method of claim 13, wherein the first sacrifice film and the second sacrifice film are removed after forming the insulating film.

24. The method of claim 13, wherein the second sacrifice film is completely removed.

* * * * *